United States Patent
Yamaguchi et al.

[11] Patent Number: 5,849,668
[45] Date of Patent: Dec. 15, 1998

[54] OXIDE SUPERCONDUCTOR AND METHOD FOR MANUFACTURING THE SAME

[75] Inventors: Kazuya Yamaguchi; Shuichi Kohayashi; Shuetsu Haseyama; Shuji Yoshizawa, all of Tokyo, Japan

[73] Assignee: Dowa Mining Co., Ltd., Tokyo, Japan

[21] Appl. No.: 877,895

[22] Filed: Jun. 18, 1997

[30] Foreign Application Priority Data

Jul. 21, 1996 [JP] Japan ................... 8-161972

[51] Int. Cl.$^6$ ............... H01B 12/00; C04B 35/505; C04B 35/653
[52] U.S. Cl. ............... 505/126; 505/450; 505/490; 505/780; 505/785
[58] Field of Search ............... 505/125, 126, 505/780, 785, 450, 451, 490, 500

[56] References Cited

U.S. PATENT DOCUMENTS

| | | | |
|---|---|---|---|
| 5,262,391 | 11/1993 | Morita et al. | 505/1 |
| 5,278,137 | 1/1994 | Morita et al. | 505/1 |
| 5,292,716 | 3/1994 | Sakai et al. | 505/1 |
| 5,308,799 | 5/1994 | Morita et al. | 505/126 |
| 5,395,820 | 3/1995 | Murakami et al. | 505/126 |
| 5,430,010 | 7/1995 | Murakami et al. | 505/450 |
| 5,434,125 | 7/1995 | Ogawa et al. | 505/126 |
| 5,496,799 | 3/1996 | Yoshida et al. | 505/450 |

FOREIGN PATENT DOCUMENTS

| | | |
|---|---|---|
| A-2-153803 | 6/1990 | Japan . |
| A-4-119968 | 4/1992 | Japan . |
| A-4-224111 | 8/1992 | Japan . |
| A-5-9059 | 1/1993 | Japan . |
| A-5-193938 | 8/1993 | Japan . |
| A-5-301797 | 11/1993 | Japan . |
| A-7-33434 | 2/1995 | Japan . |

*Primary Examiner*—Mark Kopec
*Attorney, Agent, or Firm*—Oliff & Berridge, PLC

[57] ABSTRACT

An oxide superconductor which exhibits an uniform and high critical current density. Further, a method of manufacturing this oxide superconductor, namely, a RE—Ba—Cu—O oxide superconductor (RE is one or more kinds of rare earth elements including Y) by performing a treatment, which includes at least a burning process to be performed in a range of temperatures that are higher than a melting point of a raw material mixture containing a RE-compound raw material, Ba-compound raw material and a Cu-compound raw material, on the raw material mixture. This method further comprises a step of crushing the raw material mixture into particles and establishing the mean particle diameter of one or all of the raw materials as ranging from 50 to 80 $\mu$m.

6 Claims, 4 Drawing Sheets

UNIT($\times 10^4$ A/cm$^2$)

|    | I   | II  | III | IV  |
|----|-----|-----|-----|-----|
| Jc | 2.7 | 2.8 | 2.7 | 2.3 |

UNIT($\times 10^4$ A/cm$^2$)

|    | I   | II  | III | IV  |
|----|-----|-----|-----|-----|
| Pt | 2.6 | 2.6 | 2.5 | 2.4 |
| Pd | 2.5 | 2.5 | 2.5 | 2.3 |
| Ru | 2.6 | 2.6 | 2.6 | 2.5 |
| Rh | 2.6 | 2.6 | 2.6 | 2.5 |
| Ir | 2.4 | 2.3 | 2.5 | 2.4 |
| Os | 2.5 | 2.5 | 2.5 | 2.4 |
| Re | 2.4 | 2.4 | 2.4 | 2.3 |

UNIT($\times 10^4$ A/cm$^2$)

|    | I   | II  | III | IV  |
|----|-----|-----|-----|-----|
| Jc | 2.5 | 2.5 | 2.4 | 2.4 |

UNIT($\times 10^4$ A/cm$^2$)

|    | I   | II  | III | IV  |
|----|-----|-----|-----|-----|
| Jc | 2.3 | 2.3 | 2.3 | 2.2 |

UNIT($\times 10^4$ A/cm$^2$)

|    | I   | II  | III | IV  |
|----|-----|-----|-----|-----|
| Jc | 2.8 | 2.8 | 2.8 | 2.5 |

Fig. 8

UNIT($\times 10^4$ A/cm$^2$)

|    | I   | II  | III | IV  |
|----|-----|-----|-----|-----|
| Jc | 2.0 | 1.8 | 1.4 | 1.5 |

Fig. 9

UNIT($\times 10^4$ A/cm$^2$)

|    | I   | II  | III | IV  |
|----|-----|-----|-----|-----|
| Jc | 2.1 | 1.8 | 1.5 | 1.6 |

UNIT(×10⁴ A/cm²)

|    | I   | II  | III | IV  |
|----|-----|-----|-----|-----|
| Jc | 2.7 | 3.4 | 3.5 | 3.6 |

UNIT(×10⁴ A/cm²)

|    | I   | II  | III | IV  |
|----|-----|-----|-----|-----|
| Jc | 2.3 | 2.2 | 2.2 | 2.5 |

OXIDE SUPERCONDUCTOR AND METHOD FOR MANUFACTURING THE SAME

BACKGROUND OF THE INVENTION

1. Field of the Invention

The present invention relates to an oxide superconductor which exhibits excellent superconducting properties such as a high critical current density, and to a method of manufacturing such an oxide superconductor. Further, the present invention is applicable to, for example, a current lead, magnetic bearing, a magnetic shielding and to a bulk magnet.

2. Description of the Related Art

Hitherto, there has been known a conventional method of manufacturing such a kind of an oxide superconductor (see Japanese Examined Patent Publication No. Hei 7-51463/1996 Official Gazette), by which a RE—Ba—Cu—O oxide superconductor (incidentally, RE is a rare earth element including Y) is manufactured by performing a treatment on a raw material mixture containing a RE compound, Ba compound and a Cu compound (incidentally, this treatment includes at least a burning (or baking) process to be performed in a range of temperatures that are higher than the melting point of such a raw material mixture).

In the case of this conventional manufacturing method, the raw material mixture, in which the RE compound, the Ba compound and the Cu compound are mixed in a predetermined mole ratio, is once melted. Thereafter, the raw material mixture is quenched and solidified. Then, the solidified raw material mixture is pulverized or crushed into fine powder. Subsequently, such powder is heated again to a temperature of a high temperature region in which the powdery mixture partially presents a liquid phase. Thereafter, the mixture is gradually cooled. Thus, a superconducting phase is grown. Furthermore, an oxide superconductor exhibiting a relatively high critical current density can be obtained by performing annealing process in an oxygen atmosphere.

However, in the case of the aforementioned manufacturing method, the coagulation and condensing of the raw materials occur when once melting the raw material mixture for forming a RE—Ba—Cu—O superconductor. Thus, it is necessary for uniformly dispersing the raw materials to crush the raw materials into very fine powder. Moreover, the density of a sample (or specimen), which is melted and recrystallized by using fine raw materials, becomes very high. Thus, the conventional method has problems in that the diffusion velocity of oxygen is low and that an oxygen annealing time is very long.

The present invention is accomplished to solve the aforementioned problems of the prior art.

SUMMARY OF THE INVENTION

Accordingly, an object of the present invention is to provide an oxide superconductor which has superconducting properties and uniform higher critical current density.

Further, another object of the present invention is to provide a simple method of manufacturing such an oxide superconductor at a low cost.

To achieve the foregoing objects, in accordance with an aspect of the present invention, there is provided an oxide superconductor (hereunder sometimes referred to as a first oxide superconductor of the present invention) in which fine particles (or grains) of a $RE_2BaCuO_5$ phase (RE is one or more kinds of rare earth elements including Y) are dispersed in a crystal of a $REBa_2Cu_3O_{7-x}$ phase. In the first oxide superconductor of the present invention, fine voids, each of which has a diameter of 10 to 500 $\mu$m, are dispersed therein.

In accordance with another aspect of the present invention, there is provided another oxide superconductor (hereunder sometimes referred to as a second oxide superconductor of the present invention) in which fine particles of a $RE_2BaCuO_5$ phase (RE is one or more kinds of rare earth elements including Y) are dispersed in a crystal of a $REBa_2Cu_3O_{7-x}$ phase. In the second oxide superconductor of the present invention, the density thereof is 5 to 6 g/cm$^3$.

In accordance with a further aspect of the present invention, there is provided still another oxide superconductor (hereunder sometimes referred to as a third oxide superconductor of the present invention) in which fine particles of a $RE_2BaCuO_5$ phase (RE is one or more kinds of rare earth elements including Y) are dispersed in a crystal of a $REBa_2Cu_3O_{7-x}$ phase. In the third oxide superconductor of the present invention, fine voids, each of which has a mean particle diameter (or size) of 10 to 500 $\mu$m, are dispersed therein. Moreover, the density thereof is 5 to 6 g/cm$^3$.

In the case of an embodiment (hereunder sometimes referred to as a fourth oxide superconductor of the present invention) of the first, second or third oxide superconductor of the present invention), the fourth oxide superconductor of the present invention contains 0.05 to 5 in percent by weight (wt %) of one or more kinds of elements of metals Pt, Pd, Ru, Rh, Ir and Os and compounds thereof.

In the case of an embodiment (hereunder sometimes referred to as a fifth oxide superconductor of the present invention) of the first, second, third or fourth oxide superconductor of the present invention), the fifth oxide superconductor of the present invention contains 1 to 30 wt % of Ag.

In accordance with still another aspect of the present invention, there is provided an oxide-superconductor manufacturing method (hereunder sometimes referred to as a first method of the present invention) of manufacturing a RE—Ba—Cu—O oxide superconductor (RE is one or more kinds of rare earth elements including Y) by performing a treatment, which includes at least a burning process to be performed in a range of temperatures that are higher than the melting point of a raw material mixture containing a RE-compound raw material, Ba-compound raw material and a Cu-compound raw material, on the aforesaid raw material mixture. The first method of the present invention further comprises the step of crushing the aforesaid raw material mixture into particles after the burning thereof, and of establishing the mean particle diameter (or size) of one or all of the aforesaid raw materials as ranging from 50 to 80 $\mu$m.

In the case of an embodiment (hereunder sometimes referred to as a second method of the present invention) of the first method of the present invention, 0.05 to 5 wt % of one or more kinds of elements of metals Pt, Pd, Ru, Rh, Ir and Os and compounds thereof are added to the aforesaid raw material mixture.

In the case of an embodiment (hereunder sometimes referred to as a third method of the present invention) of the first or second method of the present invention, 1 to 30 wt % of Ag is further added to the aforesaid raw material mixture.

When manufacturing a RE—Ba—Cu—O oxide superconductor (RE is one or more kinds of rare earth elements including Y) by performing a treatment, which includes at least a burning process to be performed in a range of temperatures that are higher than the melting point of a raw material mixture containing a RE-compound raw material, Ba-compound raw material and a Cu-compound raw material, on the aforesaid raw material mixture, fine particles of the $RE_2BaCuO_5$ phase, which have a mean particle diameter of 1 to 30 μm or so, are dispersed in a crystal of the $REBa_2Cu_3O_{7-x}$ phase. Consequently, the critical current can be increased.

Moreover, according to the oxide superconductor manufacturing method of the present invention, the aforesaid raw material mixture is burned and pulverized into particles in such a manner that the mean particle diameter of one or all of the aforesaid raw materials is adjusted to a size in the range from 50 to 80 μm. Thus, the density of each compact (or pellet) is lowered to 4 to 5 g/cm³ by using such a raw material mixture. When performing the melting and solidifying of the raw materials by using such low-density compacts, air or gas is left in the materials because solidification commences from outer peripheral portions thereof. Thus, after the melting and crystallizing of the materials, a large number of fine voids, whose diameters range from 10 to 500 μm, are dispersed therein. The presence of such voids accelerate the diffusion of oxygen in the materials, so that an annealing time can be reduced. Consequently, an oxide superconductor, which exhibits a uniform high critical current density, can be obtained. Incidentally, in the portions whose depths are 2 to 5 mm or so (usually, 3 mm) from the surface of the sample, the number of voids is small because the gas is discharged from such portions to the outside of the sample even when the sample is solidified. However, the diffusion of oxygen is easily promoted in such portions. Thus, the annealing time can be decreased, similarly as in the central portion of the sample. Consequently, an oxide superconductor, which exhibits a high critical current density, can be obtained. Moreover, the presence of such voids restrains occurrences of disordered microcracks that are not parallel to an a-b crystallographic plane and become liable to occur when the outside diameter and thickness of this material is larger than 40 mm and 20 mm, respectively. Incidentally, it is confirmed as a result of an experiment by the Inventors of the present invention that an oxide superconductor having similar advantageous effects can be obtained by setting the mean particle diameter of one or more kinds of the aforementioned raw materials as ranging from 50 to 80 μm.

Incidentally, Pt sometimes gets mixed with raw materials from a platinum crucible when making the raw material mixture for forming superconductors. However, the Inventors of the present invention have confirmed that similar advantages effects can be obtained even when 0.05 to 5 wt % of Pt is contained in the raw material mixture and that an oxide superconductor having similar advantageous effects can be obtained even when 0.05 to 5 wt % of one or more kinds of elements of metals Pt, Pd, Ru, Rh, Ir and Os and compounds thereof are added to the raw material mixture (incidentally, in the case of each of these compounds, the numerical values 0.05 to 5 wt % are those of a rate (expressed in percent by weight) of the amount of such a metallic element contained in the corresponding compound to the total amount of this compound).

Furthermore, when 1 to 30 wt % of metal Ag or of the compound powder thereof is added to the raw material mixture, the mechanical-strength and water-resistance of the oxide superconductor are enhanced (incidentally, in the case of the compound powder of Ag, the numerical values 1 to 30 wt % are those of a rate (expressed in percent by weight) of the amount of Ag contained in the corresponding compound to the total amount of this compound).

As above described, in accordance with the present invention, when producing a RE—Ba—Cu—O oxide superconductor, a raw material mixture is pulverized, so that the mean particle diameter of at least one kind of raw materials contained in the raw material mixture ranges from 50 to 80 μm. Thus, a large number of fine voids having diameters of 10 to 500 μm are dispersed in the sample after the melting and crystallizing thereof. Consequently, the annealing time can be reduced. Moreover, an oxide superconductor, which exhibits a uniform high critical current density, can be obtained.

BRIEF DESCRIPTION OF THE DRAWINGS

Other features, objects and advantages of the present invention will become apparent from the following description of preferred embodiments with reference to the drawings in which like reference characters designate like or corresponding parts throughout several views, and in which:

FIG. 8 is a table showing a result of measurement of the critical current density (Jc) of each of four regions I, II, III and IV, which are respectively obtained by partitioning the oxide superconductive sample manufactured in the case of the "Comparative Example 1" every 3.5 mm from the top of the center axis thereof to the bottom, at a temperature of 77 [K] in an external magnetic field 0 [T];

FIG. 9 is a table showing a result of measurement of the critical current density (Jc) of each of four regions I, II, III and IV, which are respectively obtained by partitioning the oxide superconductive sample manufactured in the case of "Comparative Example 2" (to be described later) every 3.5 mm from the top of the center axis thereof to the bottom, at a temperature of 77 [K] in an external magnetic field 0 [T];

DETAILED DESCRIPTION OF THE PREFERRED EMBODIMENTS

Figures 1, 2, 3:
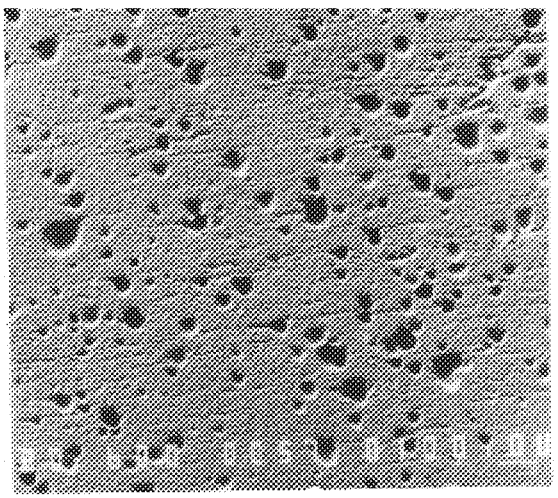
FIG. 1 is a scanning electron microscope photo showing a section of an oxide superconductive sample or specimen manufactured in the case of "Example 1" (to be described later) of the present invention.
FIG. 2 is a table showing a result of measurement of the critical current density (Jc) of each of four regions I, II, III and IV, which are respectively obtained by partitioning the oxide superconductive sample manufactured in the case of the "Example 1" of the present invention every 3.5 mm from the top of the center axis thereof to the bottom, at a temperature of 77 [K] in an external magnetic field 0 [T]
FIG. 3 is a table showing a result of measurement of the critical current density (Jc) of each of four regions I, II, III and IV, which are respectively obtained by partitioning the oxide superconductive sample manufactured in the case of "Example 2" (to be described later) of the present invention every 3.5 mm from the top of the center axis thereof to the bottom, at a temperature of 77 [K] in an external magnetic field 0 [T]

Hereinafter, the present invention will be described in detail with reference to the following examples.

EXAMPLE 1

In the case of this example, briefly, Y was used as RE of the RE compound composing a raw material mixture for forming an oxide superconductor. Further, such a raw material mixture was pulverized into powder so that the mean particle diameter of the powder was about 60 $\mu$m.

First, after weighing powdery raw materials, namely, $Y_2O_3$ powder, $BaCO_3$ powder and CuO powder so that the composition ratio Y:Ba:Cu was 18:24:34, only $BaCO_3$ powder and CuO powder were burned in a platinum crucible at a temperature of 950 degrees centigrade for two hours. Thus, calcined powder containing $BaCuO_2$ and CuO was obtained (in a mole ratio of BaCuO2 to CuO, which was 24.10). Subsequently, this calcined powder was pulverized by using a pot mill, so that the mean particle diameter was about 2 $\mu$m. Then, the pulverized powder was mixed with $Y_2O_3$ powder that was preliminarily weighted and had a mean particle diameter of about 2 $\mu$m. Next, the temperature of this mixture powder was raised from room temperature to 940 degrees centigrade in the air for ten hours Further, the mixture powder was maintained at this temperature for thirty hours. Thereafter, the temperature of the mixture powder was lowered to room temperature and then, the mixture powder undergoes the calcining. Further, this calcined mixture powder was pulverized in an agate mortar, so that the mean particle diameter of the mixture powder was about 60 $\mu$m. Subsequently, this pulverized mixture powder was press-molded into a disk-like compact which was 50 in outer diameter and was 20 mm in thickness and was a raw material mixture for forming a superconductor. At that time, a measurement of the density of the compact was performed, so that the density thereof was 4.8 g/cm$^3$.

Subsequently, this compact was put on an alumina board or substrate and was then put into a semi-melted state by being heated to a temperature of 1150 degrees centigrade in the air. Thereafter, the temperature of the compact was lowered to a temperature of 1000 degrees centigrade at a rate of 10 degrees centigrade (°C.) per minute. Then, a preliminarily produced seed crystal of NdBaCuO molten material compound was brought into contact with an upper part of the compact in such a manner that the direction of growth of the seed crystal was parallel with the c-axis. Further, a temperature gradient of 5° C./cm was vertically imposed onto the compact in such a way that the upper part of the compact was at a lower temperature side. Then, the compact was gradually cooled at a rate of 1° C./hr to a temperature of 900° C. Furthermore, the temperature of the compact was lowered at a rate of 1° C./hr to room temperature. Thus, the crystallization of the compact was performed.

Subsequently, the crystallized compact was placed in a furnace adapted to be able to perform inert gas replacement. Then, the inner pressure of the furnace was reduced by a rotary pump to a pressure of 0.1 Torr. Thence, oxygen gas was poured into the furnace, so that the inner pressure of the furnace was equal to an atmospheric pressure and that the partial pressure of oxygen was 95% or more of the inner pressure of the furnace. Thereafter, the temperature in the furnace was raised from room temperature to a temperature of 600° C. over a time period of 10 hours, during oxygen gas was simultaneously poured into the furnace at a flow rate of 0.5 L/min. Thereafter, a time period of 100 hours was required to gradually lower the temperature in the furnace from 600° C. to 300° C. Thus, a sample of a superconductor was produced.

Then, the sample of the superconductor, which was obtained in the aforementioned manner, was cut. Further, when a section of the sample was observed by using a scanning electron microscope, it was found that fine particles of the $Y_2BaCuO_5$ phase, which have particle diameters of 0.1 to 30 $\mu$m, were dispersed in a crystal of the $YBa_2Cu_3O_{7-x}$ phase, and that fine voids of diameters ranging from 10 to 500 $\mu$m were dispersed in a portion, whose depth was not less than about 3 mm, of the sample. Furthermore, when measured, the density of the entire superconductor sample was 5.6 g/cm3. Moreover, it was found that the entire sample was oriented in the direction of the c-axis and that this superconductor sample was substantially signal crystal. FIG. 1 illustrates a scanning electron microscope photo taken at that time.

Further, the critical current density (Jc) of each of four regions I, II, III and IV, which were respectively obtained by partitioning the oxide superconductive sample every 3.5 mm from the top of the center axis thereof to the bottom, was measured at a temperature of 77 [K] in an external magnetic field 0 [T]. FIG. 2 shows values of the critical current density (Jc) in each of the four regions.

As above described, in the case of the oxide superconductor manufactured by the manufacturing method of this embodiment, the fine voids were uniformly dispersed therein. Thus, the diffusion rate of oxygen was increased. Thus, the entire sample has a high critical current density by performing the annealing in a short time

EXAMPLE 2

In the case of this example, briefly, Yb was used as RE of the RE compound composing a raw material mixture for forming an oxide superconductor. Further, 0.5 wt % of each of the following kinds of metallic powder, namely, each of Pt powder, Pd powder, Ru powder, Rh powder, Ir powder, Os powder and Re powder was added to and mixed with a raw material mixture. Then, a resultant raw material mixture was pulverized into powder so that the mean particle diameter of the powder was about 55 µm.

First, powdery raw materials, namely, $Yb_2O_3$ powder, $BaCO_3$ powder and CuO powder were weighted so that the composition ratio Yb:Ba:Cu was 22;26:36. Moreover, 0.5 wt % of each of the following kinds of metallic powder, namely, each of Pt powder, Pd powder, Ru powder, Rh powder, Ir powder, Os powder and Re powder was added to and mixed with a corresponding mixture of such raw materials. Subsequently, the temperature of these mixtures was raised from temperature to a temperature of 880° C. over a time period of 10 hours. Then, these mixtures were maintained at a temperature of 880° C. for 30 hours. Thereafter, the temperature of the mixtures was lowered to room temperature over a time period of 10 hours. Then, the mixtures undergo the burning (or baking) Further, these calcined mixtures were pulverized in an agate mortar, so that the mean particle diameter of the mixture powder was about 55 µm. Subsequently, each of these pulverized mixtures was press-molded into disk-like compacts, each of which was 50 mm in outer diameter and was 20 mm in thickness and was a raw material mixture for forming a superconductor. At that time, the density of each of the compacts was about 4.8 $g/cm^3$.

Next, these compacts were put on an alumina board or substrate and were then put into a semi-melted state by being heated to a temperature of 1090 degrees centigrade in the air. Thereafter, the temperature of the compacts was lowered to a temperature of 920 degrees centigrade at a rate of 10 ° C./min. Then, a preliminarily produced seed crystal of NdBaCuO molten material compound was brought into contact with an upper part of each of the compacts in such a manner that the direction of growth of the seed crystal was parallel with the c-axis. Further, a temperature gradient of 5° C./cm was vertically imposed onto each of the compacts in such a way that the upper part of each of the compacts was at a lower temperature side. Then, the temperature of the compact was gradually lowered at a rate of 1° C. hr to a temperature of 850° C. Furthermore, the temperature of the compacts was lowered at a rate of 1° C. hr to room temperature. Thus, the crystallization of each of the compacts was performed.

Subsequently, the crystallized compacts were placed in a furnace adapted to be able to perform inert gas replacement. Then, the inner pressure of the furnace was reduced by a rotary pump to a pressure of 0.1 Torr. Thence, oxygen gas was poured into the furnace, so that the inner pressure of the furnace was equal to an atmospheric pressure and that the partial pressure of oxygen was 95% or more of the inner pressure of the furnace. Thereafter, the temperature in the furnace was raised from room temperature to a temperature of 600° C. over a time period of 10 hours, during oxygen gas was simultaneously poured into the furnace at a flow rate of 0.5 L/min. Thereafter, a time period of 100 hours was required to gradually lower the temperature in the furnace from 600° C. to 300° C. Thus, samples of a superconductor were produced.

Then, each of the samples of the superconductor, which was obtained in the aforementioned manner, was cut. Further, when a section of each of the samples was observed by using a scanning electron microscope, it was found that fine particles of the $Yb_2BaCuO_5$ phase, which have particle diameters of 0.1 to 30 µm, were dispersed in a crystal of the $YbBa_2Cu_3O_{7-x}$ phase, and that fine voids of diameters ranging from 10 to 500 µm were dispersed in a portion, whose depth was not less than about 3 mm, of each of the samples in a ratio of 10 to 200 per mm2. Furthermore, when measured, the density of the entirety of each of the superconductor samples was 5.8 $g/cm^3$. Moreover, it was found that the entire sample was oriented in the direction of the c-axis and that this superconductor sample was substantially signal crystal.

Further, the critical current density (Jc) of each of four regions I, II, III and IV that were respectively obtained by partitioning each of the disk-like oxide superconductive samples, to which Pt, Pd, Ru, Rh, Ir, Os and Re were respectively added, every 3.5 mm from the top of the center axis thereof to the bottom, was measured at a temperature of 77 [K] in an external magnetic field 0 [T]. FIG. 3 shows values of the critical current density (Jc) in the four regions of each of the samples.

As above described, in the case of the oxide superconductor manufactured by the manufacturing method of this embodiment, the fine voids were uniformly dispersed therein. Thus, the diffusion rate of oxygen was increased. Consequently, the entire sample has a high critical current density by performing the annealing in a short time.

EXAMPLE 3

In the case of this example, briefly, Ho was used as RE of the RE compound composing a raw material mixture for forming an oxide superconductor. Further, such a raw material mixture was pulverized into powder so that the mean particle diameter of the powder was about 70 µm.

First, after powdery raw materials, namely, $Ho_2O_3$ powder, $BaCO_3$ powder and CuO powder were weighted so that the composition ratio Ho:Ba:Cu was 20:25:35, these raw materials were mixed with one another and further were molten in a platinum crucible at a temperature of 1400 degrees centigrade for 30 minutes. Then, the molten materials were solidified by performing the casting and quenching thereof. Subsequently, this solidified or coagulated materials were pulverized into powder by using a pot mill, so that the mean particle diameter of the powder was about 2 µm. Next, the temperature of this mixture powder was raised from room temperature to 940 degrees centigrade in the air over a time period of ten hours, Further, the mixture powder was maintained at this temperature for thirty hours. Thereafter, the temperature of the mixture powder was lowered to room temperature over a time period of ten hours, and then, the mixture powder undergoes the calcining. Further, this calcined mixture powder was pulverized in an agate mortar, so that the mean particle diameter of the mixture powder was about 70 µm. Subsequently, this pulverized mixture powder was press-molded into a disk-like compact which was 50 mm in outer diameter and was 20 mm in thickness and was a raw material mixture for forming a superconductor. At that time, a measurement of the density of the compact was performed, so that the density thereof was 4.7 $g/cm^3$.

Subsequently, this compact was put on an alumina board or substrate and was then put into a semi-melted state by being heated to a temperature of 1150 degrees centigrade in the air. Thereafter, the temperature of the compact was lowered to a temperature of 1000 degrees centigrade at a rate of 10 degrees centigrade (°C.) per minute. Then, a preliminarily produced seed crystal of NdBaCuO molten material compound was brought into contact with an upper part of the compact in such a manner that the direction of growth of the seed crystal was parallel with the c-axis. Further, a temperature gradient of 5° C./cm was vertically imposed onto the compact in such a way that the upper part of the compact was at a lower temperature side. Thee, the temperature of the compact was gradually lowered at a rate of 1° C./hr to a temperature of 900° C. Furthermore, the temperature of the compact was lowered at a rate of 10° C./hr to room temperature. Thus, the crystallization of the compact was performed.

Subsequently, the crystallized compact was placed in a furnace adapted to be able to perform inert gas replacement. Then, the inner pressure of the furnace was reduced by a rotary pump to a pressure of 0.1 Torr. Thence, oxygen gas was poured into the furnace, so that the inner pressure of the furnace was equal to an atmospheric pressure and that the partial pressure of oxygen was 95% or more of the inner pressure of the furnace. Thereafter, the temperature in the furnace was raised from room temperature to a temperature of 600° C. over a time period of 10 hours, during oxygen gas was simultaneously poured into the furnace at a flow rate of 0.5 L/min. Thereafter, a time period of 100 hours was required to gradually lower the temperature in the furnace from 600° C. to 300° C. Thus, a sample of a superconductor was produced.

Then, the sample of the superconductor, which was obtained in the aforementioned manner, was cut. Further, when a section of the sample was observed by using a scanning electron microscope, it was found that fine particles of the $Ho_2BaCuO_5$ phase, which have particle diameters of 0.1 to 30 $\mu$m, were dispersed in a crystal of the $HoBa_2Cu_3O_{7-x}$ phase, and that fine voids of diameters ranging from 10 to 500$\mu$m were dispersed in a portion, whose depth was not less than about 3 mm, of the sample. Furthermore, when measured, the density of the entire superconductor sample was 5.4 g/cm$^3$. Moreover, it was found that the entire sample was oriented in the direction of the c-axis and that this superconductor sample was substantially signal crystal.

Figures 4, 5, 6, 7:
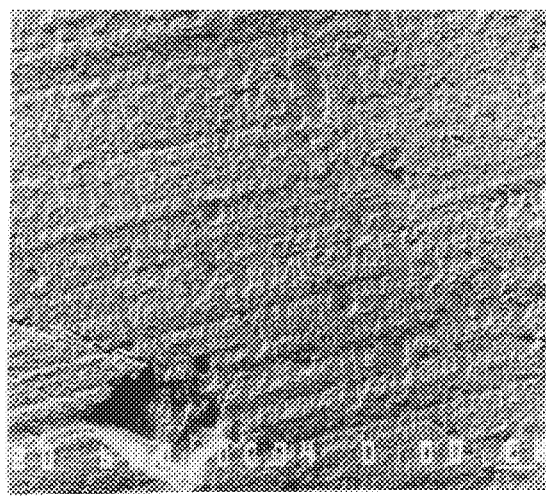
FIG. 4 is a table showing a result of measurement of the critical current density (Jc) of each of four regions I, II, III and IV, which are respectively obtained by partitioning the oxide superconductive sample manufactured in the case of "Example 3" (to be described later) of the present invention every 3.5 mm from the top of the center axis thereof to the bottom, at a temperature of 77 [K] in an external magnetic field 0 [T]
FIG. 5 is a table showing a result of measurement of the critical current density (Jc) of each of four regions I, II, III and IV, which are respectively obtained by partitioning the oxide superconductive sample manufactured in the case of "Example 4" (to be described later) of the present invention every 3.5 mm from the top of the center axis thereof to the bottom, at a temperature of 77 [K] in an external magnetic field 0 [T]
FIG. 6 is a table showing a result of measurement of the critical current density (Jc) of each of four regions I, II, III and IV, which are respectively obtained by partitioning the oxide superconductive sample manufactured in the case of "Example 5" (to be described later) of the present invention every 3.5 mm from the top of the center axis thereof to the bottom, at a temperature of 77 [K] in an external magnetic field 0 [T]
FIG. 7 is a scanning electron microscope photo showing a section of an oxide superconductive sample or specimen manufactured in the case of "Comparative Example 1" (to be described later) of the present invention.

Further, the critical current density (Jc) of each of four regions I, II, III and IV, which were respectively obtained by partitioning this oxide superconductive sample every 3.5 mm from the top of the center axis thereof to the bottom, was measured at a temperature of 77 [K] in an external magnetic field 0 [T]. FIG. 4 shows values of the critical current density (Jc) in each of the four regions.

As above described, in the case of the oxide superconductor manufactured by the manufacturing method of this embodiment, the fine voids were uniformly dispersed therein. Thus, the diffusion rate of oxygen was increased. Consequently, the entire sample has a high critical current density by performing the annealing in a short time.

EXAMPLE 4

In the case of this example, briefly, Nd was used as RE of the RE compound composing a raw material mixture for forming an oxide superconductor. Further, the aforesaid raw material mixture was pulverized into powder so that the mean particle diameter of the powder was about 60 $\mu$m.

First, after weighing powdery raw materials, namely, $Nd_2O_3$ powder, $BaCO_3$ powder and CuO powder so that the composition ratio Nd:Ba:Cu was 1.8:2.4:3.4, only $BaCO_3$ powder and CuO powder were burned in a platinum crucible at a temperature of 880 degrees centigrade for two hours. Thus, calcined powder containing $BaCuO_2$ and CuO was obtained (in a mole ratio of $BaCuO_2$ to CuO, which was 2.4:1.0). Subsequently, this calcined powder was pulverized in an agate mortar, so that the mean particle diameter was about 60 $\mu$m. Then, the pulverized powder was mixed with $Nd_2O_3$ powder, which was preliminarily weighted, and with 0.5 wt % of Pt powder. Subsequently, this pulverized mixture powder was press-molded into a disk-like compact which was 50 mm in outer diameter and was 20 mm in thickness and was a raw material mixture for forming a superconductor. At that time, a measurement of the density of the compact was performed, so that the density thereof was 4.8 g/cm$^3$.

Next, this compact was put on an alumina board or substrate and was then put into a semi-melted state by being heated to a temperature of 1130 degrees centigrade under the partial pressure of oxygen of 10-3 atm. Thereafter, the temperature of the compact was lowered to a temperature of 1080 degrees centigrade at a rate of 10° C./min. Then, a crystal preliminarily, which was produced in such a manner that particles of $Nd_2Ba_{0.5}Sr_{0.5}CuO_5$ phase was dispersed in a part of $Nd(Ba_{0.5}Sr_{0.5})_2Cu_3O_{7-x}$ phase in a composition ratio of the former to the latter 32 1:0.4 and that the direction of growth thereof was parallel to the c-axis, was used as a seed crystal and was brought into contact with an upper part of the compact. Further, a temperature gradient of 5° C./cm was vertically imposed onto the compact in such a way that the upper part of the compact was at a lower temperature side. Then, the temperature of the compact was gradually lowered at a rate of 1° C./hr to room temperature. Thus, the crystallization of the compact was performed.

Subsequently, the crystallized compact was placed in a furnace adapted to be able to perform inert gas replacement. Then, the inner pressure of the furnace was reduced by a rotary pump to a pressure of 0.1 Torr. Thence, oxygen gas was poured into the furnace, so that the inner pressure of the furnace was equal to an atmospheric pressure and that the partial pressure of oxygen was 95% or more of the inner pressure of the furnace. Thereafter, the temperature in the furnace was raised from room temperature to a temperature of 600° C. over a time period of 10 hours, during oxygen gas was simultaneously poured into the furnace at a flow rate of 0.5 L/min. Thereafter, a time period of 100 hours was required to gradually cool the furnace by lowering the temperature from 600° C. to 300° C. Thus, a sample of a superconductor was produced.

Then, the sample of the superconductor, which was obtained in the aforementioned manner, was cut. Further, when a section of the sample was observed by using a scanning electron microscope, it was found that fine particles of the $Nd_4Ba_2Cu_2O_{10}$ phase, which have particle diameters of 0.1 to 30 $\mu$m, were dispersed in a crystal of the $NdBa_2Cu_3O_{7-x}$ phase, and that fine voids of diameters ranging from 10 to 500 $\mu$m were dispersed in a ratio of 10 to 200 per mm$^2$ in a portion, whose depth was not less than about 3 mm, of the sample. Furthermore, when measured, the density of the entire superconductor sample was 5.9 g/cm$^3$. Moreover, it was found that the entire sample was oriented in the direction of the c-axis and that this superconductor sample was substantially signal crystal.

Further, the critical current density (Jc) of each of four regions I, II, III and IV, which were respectively obtained by partitioning the oxide superconductive sample every 3.5 mm from the top of the center axis thereof to the bottom, was measured at a temperature of 77 [K] in an external magnetic field 0 [T]. FIG. 5 shows values of the critical current density (Jc) in each of the four regions in which the measurement was performed.

As above described, in the case of the oxide superconductor manufactured by the manufacturing method of this embodiment, the fine voids were uniformly dispersed therein. Thus, the diffusion rate of oxygen was increased. Thus, the entire sample has a high critical current density by performing the annealing in a short time.

EXAMPLE 5

In the case of this example, briefly, Sm was used as RE of the RE compound composing a raw material mixture for forming an oxide superconductor. Further, the aforesaid raw material mixture was pulverized into powder so that the mean particle diameter of the powder was about 60 $\mu$m. Further, 0.5 wt % of Pt powder and 10 wt % of Ag powder were added thereto.

First, after weighing powdery raw materials, namely, $Sm_2O_3$ powder, $BaCO_3$ powder and CuO powder so that the composition ratio Sm:Ba:Cu was 1.8:2.4:3.4, only $BaCO_3$ powder and CuO powder were burned in a platinum crucible at a temperature of 880 degrees centigrade for two hours. Thus, calcined powder containing $BaCuO_2$ and CuO was obtained (in a mole ratio of $BaCuO_2$ to CuO, which was 2.4:1.0). Subsequently, this calcined powder was pulverized in an agate mortar, so that the mean particle diameter was about 60 $\mu$m. Then, the pulverized powder was mixed with $Sm_2O_3$ powder, which was preliminarily weighted, and with 0.5 wt % of Pt powder and 10 wt % of Ag powder. Subsequently, this pulverized mixture powder was press-molded into a disk-like compact which was 50 mm in outer diameter and was 20 mm in thickness and was a raw material mixture for forming a superconductor. At that time, a measurement of the density of the compact was performed, so that the density thereof was 4.8 g/cm$^3$.

Next, this compact was put on an alumina board or substrate and was then put into a semi-melted state by being heated to a temperature of 1150 degrees centigrade in the air. Thereafter, the temperature of the compact was lowered to a temperature of 1000 degrees centigrade at a rate of 10° C./min. Then, a preliminarily produced seed crystal of NdBaCuO molten material compound was brought into contact with an upper part of the compact in such a manner that the direction of growth of the seed crystal was parallel with the c-axis. Further, a temperature gradient of 5° C./cm was vertically imposed onto the compact in such a way that the upper part of the compact was at a lower temperature side. Then, the compact was gradually cooled at a rate of 1° C./hr to a temperature of 900° C. Furthermore, the temperature of the compact was lowered at a rate of 1° C./hr to room temperature. Thus, the crystallization of the compact was performed.

Subsequently, the crystallized compact was placed in a furnace adapted to be able to perform inert gas replacement. Then, the inner pressure of the furnace was reduced by a rotary pump to a pressure of 0.1 Torr. Thence, oxygen gas was poured into the furnace, so that the inner pressure of the furnace was equal to an atmospheric pressure and that the partial pressure of oxygen was 95% or more of the inner pressure of the furnace. Thereafter, the temperature in the furnace was raised from room temperature to a temperature of 600° C. over a time period of 10 hours, during oxygen gas was simultaneously poured into the furnace at a flow rate of 0.5 L/min. Thereafter, a time period of 100 hours was required to gradually cool the furnace by lowering the temperature from 600° C. to 300° C. Thus, a sample of a superconductor was produced.

Then, the sample of the superconductor, which was obtained in the aforementioned manner, was cut. Further, when a section of the sample was observed by using a scanning electron microscope, it was found that fine particles of the $Sm_2BaCuO_5$ phase, which have particle diameters of 0.1 to 30 $\mu$m, were dispersed in a crystal of the $SmBa_2Cu_3O_{7-x}$ phase, and that fine voids of diameters ranging from 10 to 500 $\mu$m were dispersed in a ratio of 10 to 200 per mm$^2$ in a portion, whose depth was not less than about 3 mm, of the sample. Furthermore, when measured, the density of the entire superconductor sample was 5.9 g/cm$^3$. Moreover, it was found that the entire sample was oriented in the direction of the c-axis and that this superconductor sample was substantially signal crystal.

Further, the critical current density (Jc) of each of four regions I, II, III and IV, which were respectively obtained by partitioning the oxide superconductive sample every 3.5 mm from the top of the center axis thereof to the bottom, was measured at a temperature of 77 [K] in an external magnetic field 0 [T]. FIG. 6 shows values of the critical current density (Jc) in each of the four regions in which the measurement was performed.

As above described, in the case of the oxide superconductor manufactured by the manufacturing method of this embodiment, the fine voids were uniformly dispersed therein. Thus, the diffusion rate of oxygen was increased. Thus, the entire sample has a high critical current density by performing the annealing in a short time.

EXAMPLE 6

First, after weighing powdery raw materials, namely, $Y_2O_3$ powder, $BaCO_3$ powder and CuO powder so that the composition ratio Y:Ba:Cu was 18:24:34, only $BaCO_3$ powder and CuO powder were burned in a platinum crucible at a temperature of 880 degrees centigrade for 30 hours. Thus, calcined powder containing $BaCuO_2$ and CuO was obtained (in a mole ratio of $BaCuO_2$ to CuO, which was 24:10). Subsequently, this calcined powder was pulverized by using a pot mill, so that the mean particle diameter was about 2 $\mu$m. Then, the pulverized powder was mixed with $Y_2O_3$ powder, which was preliminarily weighted and had a mean particle diameter of about 1 $\mu$m, and with 0.5 wt % of Pt powder, which was added and had a mean particle diameter of about 0.02 $\mu$m. Next, the temperature of this mixture powder was raised from room temperature to 930 degrees centigrade in the air for ten hours. Further, the mixture powder was maintained at this temperature for thirty hours. Thereafter, the temperature of the mixture powder was lowered to room temperature and then, the mixture powder undergoes the calcining. Further, this calcined mixture powder was pulverized in an agate mortar, so that the mean particle diameter of the mixture powder was about 10 $\mu$m. Subsequently, this pulverized mixture powder was press-molded into a disk-like compact which was 50 in outer diameter and was 20 mm in thickness and was a raw material mixture for forming a superconductor.

Figures 10, 11, 12:
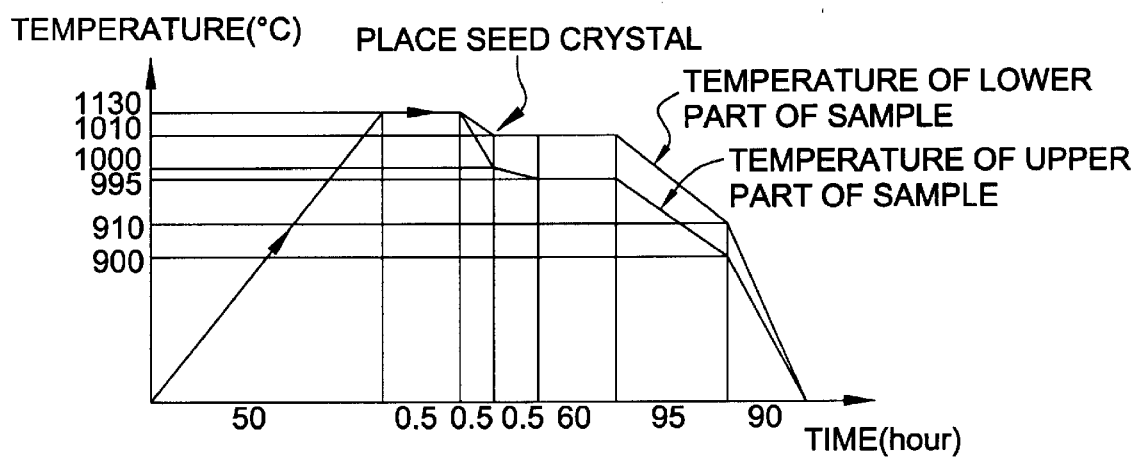
FIG. 10 is a graph illustrating a pattern of the change in temperature in the melting and crystallizing of an oxide superconductive in the case of "Example 6" (to be described later) of the present invention.
FIG. 11 is a table showing a result of measurement of the critical current density (Jc) of each of four regions I, II, III and IV, which are respectively obtained by partitioning the oxide superconductive sample manufactured in the case of the "Example 6" of the present invention every 3.5 mm from the top of the center axis thereof to the bottom, at a temperature of 77 [K] in an external magnetic field 0 [T]
FIG. 12 is a table showing a result of measurement of the critical current density (Jc) of each of four regions I, II, III and IV, which are respectively obtained by partitioning the oxide superconductive sample manufactured in the case of "Comparative Example 3" (to be described later) every 3.5 mm from the top of the center axis thereof to the bottom, at a temperature of 77 [K] in an external magnetic field 0 [T]

Subsequently, this compact was put on an alumina board or substrate and was then put into a semi-melted state by being heated to a temperature of 1130 degrees centigrade in the air. Thereafter, the temperature of the compact was rapidly lowered to a temperature of 1000 degrees centigrade (at a rate of 10° C./min) so that a temperature gradient of 5° C./cm was vertically imposed onto the compact and that the upper part of the compact was at a lower temperature side. Then, a preliminarily produced seed crystal of NdBaCuO molten material compound was brought into contact with an upper part of the compact in such a manner that the direction of growth of the seed crystal was parallel with the c-axis. Then, the compact was maintained nearly at a temperature of 995° C., at which the crystallization was commenced, nearly for 60 hours. Subsequently, the compact was gradually cooled at a rate of 1° C./hr to a temperature of 900° C. Furthermore, the temperature of the compact was lowered at a rate of 10° C./hr to room temperature. Thus, the crystallization of the compact was performed. FIG. 10 illustrates a burning temperature pattern.

Subsequently, the crystallized compact was placed in a furnace adapted to be able to perform inert gas replacement. Then, the inner pressure of the furnace was reduced by a rotary pump to a pressure of 0.1 Torr. Thence, oxygen gas was poured into the furnace, so that the inner pressure of the furnace was equal to an atmospheric pressure and that the partial pressure of oxygen was 95% or more of the inner pressure of the furnace. Thereafter, the temperature in the furnace was raised from room temperature to a temperature of 450° C. over a time period of 10 hours, during oxygen gas was simultaneously poured into the furnace at a flow rate of 0.5 L/min. Thereafter, a time period of 200 hours was required to gradually lower the temperature in the furnace from 250° C. to room temperature. Thus, a resultant material (namely, a sample of a superconductor) was produced.

Then, the resultant material was cut. Further, when a section of this material was observed by using a scanning electron microscope, it was found that fine particles of the $Y_2BaCuO_5$ phase, which have particle diameters of 0.1 to 30 $\mu$m, were dispersed in a crystal of the $YBa_2Cu_3O_7$-x phase, and that fine voids of diameters ranging from 10 to 500 $\mu$m were dispersed in a ratio of 10 to 200 per mm$^2$ in a portion, whose depth was not less than about 3 mm, of the material. Furthermore, there was obtained the entire material that reflected the seed crystal and the direction of growth thereof was oriented in the direction of the c-axis and that this material (namely, the superconductor sample) was substantially signal crystal. FIG. 1 illustrates a scanning electron microscope photo taken at that time.

Further, the critical current density (Jc) of each of four regions I, II, III and IV, which were respectively obtained by partitioning the disk-like sample every 3.5 mm from the top of the center axis thereof to the bottom, was measured at a temperature of 77 [K] in an external magnetic field 0 [T]. FIG. 11 shows values of the critical current density (Jc) obtained as results of the measurement performed in each of the four regions.

As above described, in the case of the oxide superconductor manufactured by the manufacturing method of this embodiment, the fine voids were uniformly dispersed therein. Thus, the diffusion of oxygen was completely achieved. Consequently, the entire sample has a high critical current density by performing the annealing in a short time.

Comparative Example 1

Next, a superconductor sample, in which Y was used as RE of the RE compound composing a raw material mixture for forming an oxide superconductor and such a raw material mixture was pulverized into powder so that the mean particle diameter of the powder was about 2 $\mu$m, will be described hereinbelow as a "comparative example 1".

First, after weighing powdery raw materials, namely, $Y_2O_3$ powder, $BaCO_3$ powder and CuO powder so that the composition ratio Y:Ba:Cu was 18:24:34, these raw materials were mixed with one another and further were molten in a platinum crucible at a temperature of 1400 degrees centigrade for 30 minutes. Then, the molten materials were solidified by performing the casting and quenching thereof. Subsequently, this solidified or coagulated materials were pulverized into powder by using a pot mill, so that the mean particle diameter of the powder was about 2 $\mu$m. Then, this pulverized mixture powder was press-molded into a disk-like compact which was 50 mm in outer diameter and was 20 mm in thickness and was a raw material mixture for forming a superconductor. At that time, a measurement of the density of the compact was performed, so that the density thereof was 5.2 g/cm$^3$.

Subsequently, this compact was put on an alumina board or substrate and was then put into a semi-melted state by being heated to a temperature of 1150 degrees centigrade in the air. Thereafter, the temperature of the compact was lowered to a temperature of 1000 degrees centigrade at a rate of 10 ° C./min. Then, a preliminarily produced seed crystal of NdBaCuO molten material compound was brought into contact with an upper part of the compact in such a manner that the direction of growth of the seed crystal was parallel with the c-axis. Further, a temperature gradient of 5 ° C./cm was vertically imposed onto the compact in such a way that the upper part of the compact was at a lower temperature side. Then, the temperature of the compact was gradually lowered at a rate of 1° C./hr to a temperature of 900° C. Furthermore, the temperature of the compact was lowered at a rate of 10° C./hr to room temperature. Thus, the crystallization of the compact was performed.

Subsequently, the crystallized compact was placed in a furnace adapted to be able to perform inert gas replacement. Then, the inner pressure of the furnace was reduced by a rotary pump to a pressure of 0.1 Torr. Thence, oxygen gas was poured into the furnace, so that the inner pressure of the furnace was equal to an atmospheric pressure and that the partial pressure of oxygen was 95% or more of the inner pressure of the furnace. Thereafter, the temperature in the furnace was raised from room temperature to a temperature of 600° C. over a time period of 10 hours, during oxygen gas was simultaneously poured into the furnace at a flow rate of 0.5 L/min. Thereafter, a time period of 100 hours was required to gradually lower the temperature in the furnace from 600° C. to 300° C. Thus, a sample of a superconductor was produced.

Then, the sample of the superconductor, which was obtained in the aforementioned manner, was cut. Further, when a section of the sample was observed by using a scanning electron microscope, it was found that fine particles of the $Y_2BaCuO_5$ phase, which have particle diameters of 0.1 to 30 $\mu$m, were dispersed in a crystal of the $YBa_2Cu_3O_7$-x phase, and that fine voids of diameters ranging from 10 to 500 $\mu$m were sparsely dispersed in a ratio of 0 to 9 per mm$^2$ in a portion, whose depth was not less than about 3 mm, of the sample. Furthermore, when measured, the density of the entire superconductor sample was 6.1 g/cm$^3$. Moreover, it was found that the entire sample was oriented in the direction of the c-axis and that this superconductor sample was substantially signal crystal. However, several microcracks, which were neither found in the case of the aforementioned "Example 1" to "Example 6" and were nor parallel to the a-b crystallographic plane, occurred in this superconductor sample. FIG. 7 illustrates a scanning electron microscope photo taken at that time.

Further, the critical current density (Jc) of each of four regions I, II, III and IV, which were respectively obtained by partitioning this oxide superconductive sample every 3.5 mm from the top of the center axis thereof to the bottom, was measured at a temperature of 77 [K] in an external magnetic field 0 [T]. FIG. 8 shows values of the critical current density (Jc) in each of the four regions.

As above described, in the case of the oxide superconductor manufactured by the manufacturing method of this "Comparative Example 1", there were few fine voids in the sample. Thus, the diffusion rate of oxygen was low. Consequently, in the case of performing the annealing in a short time, the critical current density in the vicinity of the central portion of the sample was low.

Comparative Example 2

Next, a superconductor sample, in which Sm was used as RE of the RE compound composing a raw material mixture for forming an oxide superconductor and such a raw material mixture was pulverized into powder so that the mean particle diameter of the powder was about 2 μm, will be described hereinbelow as a "comparative example 2".

First, after weighing powdery raw materials, namely, $Sm_2O_3$ powder, $BaCO_3$ powder and CuO powder so that the composition ratio Sm:Ba:Cu was 1.8:2.4:3.4, only $BaCO_3$ powder and CuO powder were burned in a platinum crucible at a temperature of 880 degrees centigrade for two hours. Thus, calcined powder containing $BauCO_2$ and CuO was obtained (in a mole ratio of $BaCuO_2$ to CuO, which was 2.4:1.0). Subsequently, this calcined powder was pulverized in an agate mortar, so that the mean particle diameter of the mixture powder was about 3 μm. Then, the pulverized powder was mixed with $Sm_2O_3$ powder, which was preliminarily weighted, and with 0.5 wt % of Pt powder. Subsequently, this pulverized mixture powder was press-molded into a disk-like compact which was 50 mm in outer diameter and was 20 mm in thickness and was a raw material mixture for forming a superconductor. At that time, a measurement of the density of the compact was performed, so that the density thereof was 5.2 g/cm³.

Next, this compact was put on an alumina board or substrate and was then put into a semi-melted state by being heated to a temperature of 1150 degrees centigrade in the air. Thereafter, the temperature of the compact was lowered to a temperature of 1000 degrees centigrade at a rate of 10° C./min. Then, a preliminarily produced seed crystal of NdBaCuO molten material compound was brought into contact with an upper part of the compact in such a manner that the direction of growth of the seed crystal was parallel with the c-axis. Further, a temperature gradient of 5° C./cm was vertically imposed onto the compact in such a way that the upper part of the compact was at a lower temperature side. Then, the compact was gradually cooled at a rate of 1° C./hr to a temperature of 900° C. Furthermore, the temperature of the compact was lowered at a rate of 10° C./hr to room temperature. Thus, the crystallization of the compact was performed.

Subsequently, the crystallized compact was placed in a furnace adapted to be able to perform inert gas replacement. Then, the inner pressure of the furnace was reduced by a rotary pump to a pressure of 0.1 Torr. Thence, oxygen gas was poured into the furnace, so that the inner pressure of the furnace was equal to an atmospheric pressure and that the partial pressure of oxygen was 95% or more of the inner pressure of the furnace. Thereafter, the temperature in the furnace was raised from room temperature to a temperature of 600° C. over a time period of 10 hours, during oxygen gas was simultaneously poured into the furnace at a flow rate of 0.5 L/min. Thereafter, a time period of 100 hours was required to gradually cool the furnace by lowering the temperature from 600° C. to 300° C. Thus, a sample of a superconductor was produced.

Then, the sample of the superconductor, which was obtained in the aforementioned manner, was cut. Further, when a section of the sample was observed by using a scanning electron microscope, it was found that fine particles of the $Sm_2BaCuO_5$ phase, which have particle diameters of 0.1 to 30 μm, were dispersed in a crystal of the $SmBa_2Cu_3O_{7-x}$ phase, and that fine voids of diameters ranging from 10 to 500 μm were sparsely dispersed in a ratio of 0 to 9 per mm2 in a portion, whose depth was not less than about 3 mm, of the sample. Furthermore, when measured, the density of the entire superconductor sample was 6.2 g/cm³. Moreover, it was found that the entire sample was oriented in the direction of the c-axis and that this superconductor sample was substantially signal crystal. However, several microcracks, which were neither found in the case of the aforementioned "Example 1" to "Example 6" and were nor parallel to the a-b crystallographic plane, occurred in this superconductor sample. FIG. 7 illustrates a scanning electron microscope photo taken at that time.

Further, the critical current density (Jc) of each of four regions I, II, III and IV, which were respectively obtained by partitioning this oxide superconductive sample every 3.5 mm from the top of the center axis thereof to the bottom, was measured at a temperature of 77 [K] in an external magnetic field 0 [T]. FIG. 9 shows values of the critical current density (Jc) in each of the four regions.

As above described, in the case of the oxide superconductor manufactured by the manufacturing method of this "Comparative Example 2", there were few fine voids in the sample. Thus, the diffusion rate of oxygen was low. Consequently, in the case of performing the annealing in a short time, the critical current density in the vicinity of the central portion of the sample was low.

Comparative Example 3

After weighing powdery raw materials, namely, $Y_2O_3$ powder, $BaCO_3$ powder and CuO powder so that the composition ratio Y:Ba:Cu was 18:24:34, these raw materials were mixed with one another and further were molten in a Pt crucible at a temperature of 1400 degrees centigrade for 30 minutes. Then, the molten materials were solidified by performing the casting and quenching thereof. Subsequently, this solidified or coagulated materials were pulverized into powder by using a pot mill, so that the mean particle diameter of the powder was about 2 μm. Then, this pulverized mixture powder was press-molded into a disk-like compact which was 50 mm in outer diameter and was 20 mm in thickness and was a raw material mixture for forming a superconductor.

Subsequently, this compact was put on an alumina board or substrate and was then put into a semi-melted state by being heated to a temperature of 1130 degrees centigrade in the air. Thereafter, the temperature of the compact was rapidly lowered to a temperature of 1000 degrees centigrade at a rate of 10° C./min so that a temperature gradient of 5° C./cm was vertically imposed onto the compact and that the upper part of the compact was at a lower temperature side. Then, a preliminarily produced seed crystal of NdBaCuO molten material compound was brought into contact with an upper part of the compact in such a manner that the direction of growth of the seed crystal was parallel with the c-axis. Then, the compact was maintained nearly at a temperature of 995° C., at which the crystallization was commenced, nearly for 60 hours. Subsequently, the compact was gradually cooled at a rate of 1° C./hr to a temperature of 900° C. Furthermore, the temperature of the compact was lowered at a rate of 10° C./hr to room temperature. Thus, the crystallization of the compact was performed.

Subsequently, the crystallized compact was placed in a furnace adapted to be able to perform inert gas replacement.

Then, the inner pressure of the furnace was reduced by a rotary pump to a pressure of 0.1 Torr. Thence, oxygen gas was poured into the furnace, so that the inner pressure of the furnace was equal to an atmospheric pressure and that the partial pressure of oxygen was 95% or more of the inner pressure of the furnace. Thereafter, the temperature in the furnace was raised from room temperature to a temperature of 450° C. over a time period of 10 hours, during oxygen gas was simultaneously poured into the furnace at a flow rate of 0.5 L/min. Thereafter, a time period of 200 hours was required to gradually lower the temperature in the furnace from 250° C. to room temperature. Thus, a resultant material (namely, a sample of a superconductor) was produced.

Then, the resultant material was cut. Further, when a section of this material was observed by using a scanning electron microscope, it was found that fine particles of the $Y_2BaCuO_5$ phase, which have particle diameters of 0.1 to 30 $\mu$m, were dispersed in a crystal of the $YBa_2Cu_3O_7$_x phase. However, voids of diameters ranging from 10 to 500 $\mu$m were sparsely dispersed in a ratio of 0 to 9 per mm$^2$ in a portion, whose depth was not less than about 3 mm, of the sample. Furthermore, it was found that the entire sample reflected the seed crystal and was oriented in the direction of the c-axis and that this superconductor sample was substantially signal crystal.

Further, the critical current density (Jc) of each of four regions I, II, III and IV, which were respectively obtained by partitioning this oxide superconductive sample every 3.5 mm from the top of the center axis thereof to the bottom, was measured at a temperature of 77 [K] in an external magnetic field 0 [T]. FIG. 12 shows values of the critical current density (Jc) in each of the four regions.

As above described, in the case of the oxide superconductor manufactured by the manufacturing method of this "Comparative Example 3", there were few fine voids in the sample. Thus, the diffusion rate of oxygen was low. Consequently, in the case of performing the annealing in a short time, the critical current density in the vicinity of the central portion of the sample was low.

Incidentally, in the foregoing description, there have been described the examples that respectively employ Y, Yb, Ho, Nd and Sm as RE. However, it was confirmed that oxide superconductors, which were manufactured by using other rare earth elements as RE and performing the same methods as used in the cases of the aforementioned examples, also had uniform high critical current densities.

Further, in the foregoing description, there have been described the examples that respectively use metallic Pt powder, Pd powder, Ru powder, Rh powder, Ir powder, Os powder and Re powder. However, it was confirmed that oxide superconductors, to which 0.05 to 5 wt % of compounds containing such elements were added, also had uniform high critical current densities.

Furthermore, in the case of the aforementioned examples, after the seed crystal was brought into contact with the compact, the compact was cooled at a rate of 1° C./hr to a temperature of 900° C. It was confirmed that even when the compact was maintained at a halfway temperature in this cooling process, the crystal grew larger and the magnetic properties were enhanced.

Although the preferred embodiments of the present invention have been described above, it should be understood that the present invention is not limited thereto and that other modifications will be apparent to those skilled in the art without departing from the spirit of the invention.

The scope of the present invention, therefore, is to be determined solely by the appended claims.

What is claimed is:

1. An oxide superconductor comprising:

fine particles of a $RE_2BaCuO_5$ phase (RE is one or more kinds of rare earth elements including Y); and crystals of a $REBa_2CU_3O_7$_x phase, wherein said fine particles of the $RE_2BaCuO_5$ phase are dispersed in each of said crystals of a $REBa_2Cu_3O_7$_x phase, wherein fine voids, whose mean diameter ranges from 10 to 500 $\mu$m, are dispersed therein, and wherein a density thereof is 5 to 6 g/cm$^3$.

2. The oxide superconductor according to claim 1, wherein said oxide superconductor contains 0.05 to 5 in percent by weight (wt %) of one or more kinds of elements of metals Pt, Pd, Ru, Rh, Ir and Os and compounds thereof.

3. The oxide superconductor according to claim 1, wherein said oxide superconductor of the present invention contains 1 to 30 wt % of Ag.

4. An oxide superconductor manufacturing method of manufacturing the RE—Ba—Cu—O oxide superconductor of claim 1 by a treatment, which includes at least a burning step to be performed in a range of temperatures that are higher than a melting point of a raw material mixture containing a RE-compound raw material, Ba-compound raw material and a Cu-compound raw material, on said raw material mixture, said method further comprising:

a step of crushing said raw material mixture into particles after burning thereof, and of establishing the mean particle diameter of one or all of said raw materials as ranging from 50 to 80 $\mu$m.

5. The oxide superconductor manufacturing method according to claim 4, which further comprises a step of adding 0.05 to 5 wt % of one or more kinds of elements of metals Pt, Pd, Ru, Rh, Ir and Os and compounds thereof to said raw material mixture.

6. The oxide superconductor manufacturing method according to claim 4, which further comprises a step of adding 30 wt % of Ag to said raw material mixture.

* * * * *